(12) United States Patent
Tanaka et al.

(10) Patent No.: US 12,444,597 B2
(45) Date of Patent: Oct. 14, 2025

(54) EPITAXIAL WAFER CLEANING METHOD

(71) Applicant: SHIN-ETSU HANDOTAI CO., LTD., Tokyo (JP)

(72) Inventors: Norimichi Tanaka, Annaka (JP); Hisashi Masumura, Yabuki-machi (JP); Teppei Nakata, Takasaki (JP); Yuhei Fukazu, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 18/028,244

(22) PCT Filed: Sep. 13, 2021

(86) PCT No.: PCT/JP2021/033609
§ 371 (c)(1),
(2) Date: Mar. 24, 2023

(87) PCT Pub. No.: WO2022/091609
PCT Pub. Date: May 5, 2022

(65) Prior Publication Data
US 2023/0411143 A1     Dec. 21, 2023

(30) Foreign Application Priority Data
Oct. 28, 2020   (JP) .................................. 2020-180466

(51) Int. Cl.
*H01L 21/02*     (2006.01)
*C30B 25/20*     (2006.01)
(Continued)

(52) U.S. Cl.
CPC .......... *H01L 21/0209* (2013.01); *C30B 33/00* (2013.01); *H01L 21/02057* (2013.01);
(Continued)

(58) Field of Classification Search
CPC ................................................ H01L 21/00–86
See application file for complete search history.

(56) References Cited

U.S. PATENT DOCUMENTS

| 5,861,066 A | * | 1/1999 | Moinpour ......... H01L 21/67028 |
| | | | 15/97.1 |
| 5,868,857 A | | 2/1999 | Moinpour et al. |

(Continued)

FOREIGN PATENT DOCUMENTS

| JP | H11-111661 A | 4/1999 |
| JP | 2002-198345 A | 7/2002 |

(Continued)

OTHER PUBLICATIONS

Nov. 9, 2021, International Search Report issued in International Patent Application No. PCT/JP2021/033609.

(Continued)

*Primary Examiner* — Kaj K Olsen
*Assistant Examiner* — Richard Z. Zhang
(74) *Attorney, Agent, or Firm* — Oliff PLC

(57) ABSTRACT

An epitaxial wafer cleaning method for cleaning a wafer having an epitaxial film formed on a front surface thereof, including: a first cleaning step of supplying a cleaning solution containing $O_3$ to all surfaces, including front, back, and end surfaces, of the wafer to perform spin cleaning; a second cleaning step of supplying a cleaning solution to the back and end surfaces of the wafer to perform cleaning with a roll brush after the first cleaning step; a third cleaning step of supplying a cleaning solution containing $O_3$ to the front surface of the wafer to perform spin cleaning after the second cleaning step; and a fourth cleaning step of supplying a cleaning solution containing HF to the front surface of the wafer to perform spin cleaning after the third cleaning step.

6 Claims, 2 Drawing Sheets

(51) Int. Cl.
*C30B 33/00* (2006.01)
*H01L 21/67* (2006.01)

(52) U.S. Cl.
CPC .. *H01L 21/02087* (2013.01); *H01L 21/67046* (2013.01); *C30B 25/20* (2013.01); *H01L 21/67051* (2013.01)

(56) References Cited

U.S. PATENT DOCUMENTS

| | | | |
|---|---|---|---|
| 6,560,809 B1* | 5/2003 | Atoh | H01L 21/67046 15/21.1 |
| 2003/0061675 A1* | 4/2003 | Sugarman | H01L 21/67046 15/77 |
| 2004/0031503 A1* | 2/2004 | Eitoku | B08B 3/02 134/28 |
| 2007/0093072 A1 | 4/2007 | Fukuda et al. | |
| 2012/0149175 A1* | 6/2012 | Wada | H01L 21/02057 257/E21.054 |
| 2012/0178238 A1* | 7/2012 | Sekiguchi | H01L 21/02024 257/E21.211 |
| 2014/0048100 A1* | 2/2014 | Abe | H01L 21/02052 134/3 |
| 2019/0164963 A1 | 5/2019 | Lee et al. | |

FOREIGN PATENT DOCUMENTS

| | | | |
|---|---|---|---|
| JP | 2005012076 A | * | 1/2005 |
| JP | 2010-092928 A | | 4/2010 |
| TW | 201926406 A | | 7/2019 |
| WO | 2005/057640 A1 | | 6/2005 |

OTHER PUBLICATIONS

May 2, 2023, International Preliminary Report on Patentability issued in International Patent Application No. PCT/JP2021/033609.
Sep. 11, 2024 Extended European Search Report issued in European Patent Application No. 21885728.2.
Jan. 23, 2025 Office Action issued in Taiwanese Patent Application No. 110135217.
Mar. 18, 2025 Office Action issued in Korean Patent Application No. 10-2023-7012106.

* cited by examiner

[FIG. 1]
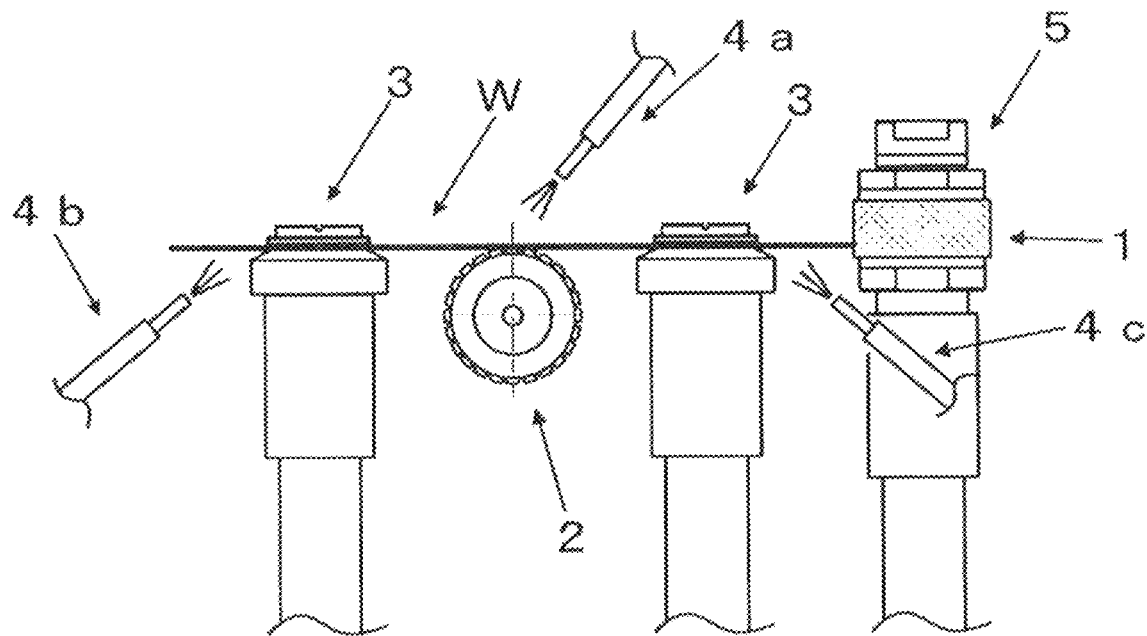
[FIG. 2]
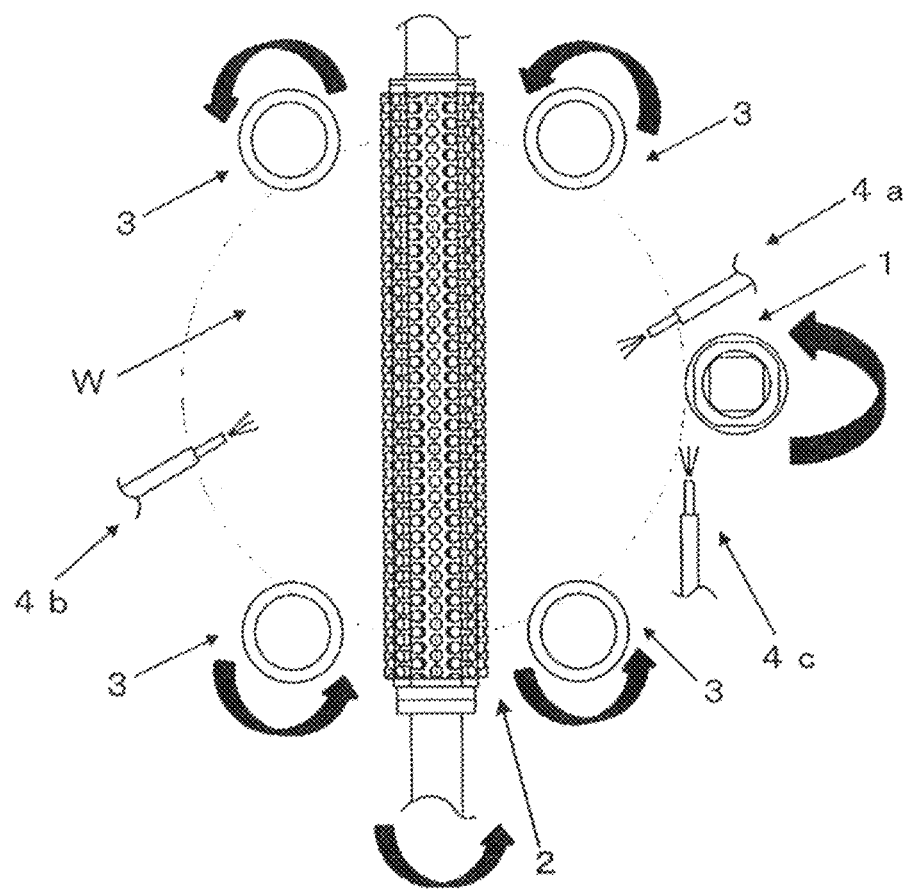

[FIG. 3]
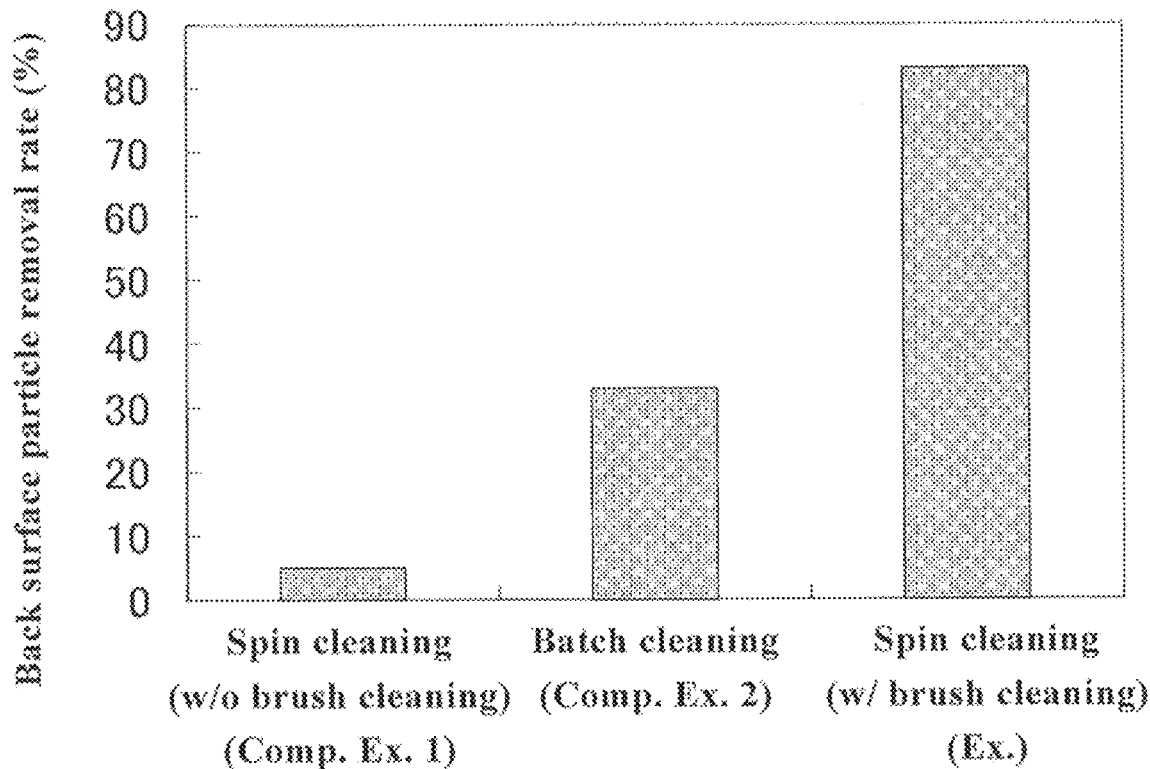
[FIG. 4]
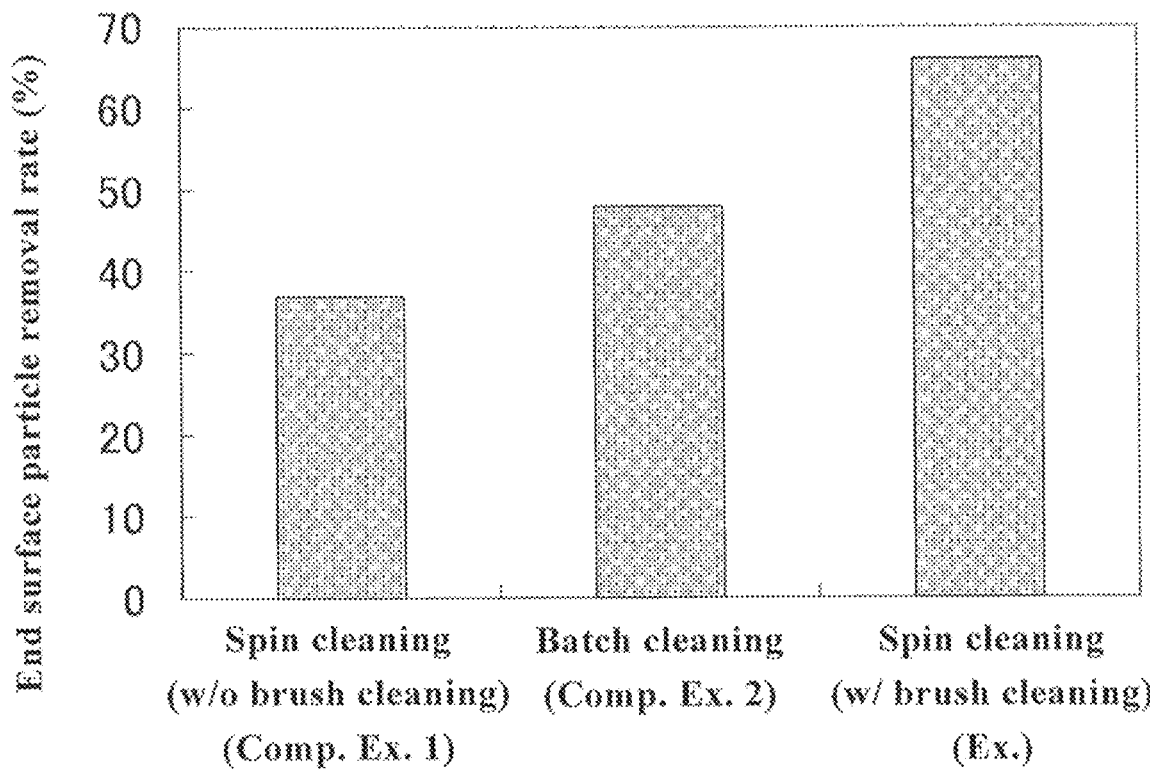

EPITAXIAL WAFER CLEANING METHOD

TECHNICAL FIELD

The present invention relates to an epitaxial wafer cleaning method.

BACKGROUND ART

With ongoing miniaturization of semiconductor devices, ever higher levels of cleanliness and quality are required for their underlying wafers. A cause of quality degradation is the presence of particles. Particles adhere to a front surface, a back surface, and an end surface (also referred to as an edge portion) of a wafer, and there are various types of, and various causes of adhesion of, such particles.

In particular, an epitaxial wafer for use in logic semiconductors has a higher quality epitaxial film formed on its front surface, on which a semiconductor device is to be formed. The epitaxial film can be formed by decomposing gases, such as trichlorosilane, at a high temperature and epitaxially growing a silicon single crystal film on the front surface of the wafer.

CITATION LIST

Patent Literature

Patent Document 1: WO 2005/057640 A1
Patent Document 2: Japanese Patent Laid-Open Publication

SUMMARY OF INVENTION

Technical Problem

There has been a problem of particle adhesion to the back surface or end surface of the wafer due to the back surface or edge portion of the wafer being in contact with, or in proximity to, a jig inside an epitaxial apparatus.

Previously, cleanliness of the front surface of a wafer, which is the surface on which a semiconductor device is to be formed, has been of importance. For example, as disclosed in Patent Document 1, cleaning techniques such as employing SC-1, SC-2, HF, and brushes have been used to clean the front surface of a wafer before forming an epitaxial film. For wafers after having an epitaxial film formed thereon, attempts to reduce particles have also been focused on reducing particles adhered to the front surface of the wafer, including performing batch cleaning and, as disclosed in Patent Document 2, using cleaning techniques such as employing ozonated water and brushes.

Ongoing miniaturization of semiconductor devices has resulted in the particle size, which is a concern during semiconductor device manufacturing processes, becoming smaller. As such, particles not only on the front surface of the wafer but also on the back surface or edge portion thereof now greatly affect yields of semiconductor devices. This has made the effect of particles adhered to the back surface or edge portion of the wafer during epitaxial film formation non-negligible.

The present invention has been made to solve the above problems. An object of the present invention is to provide an epitaxial wafer cleaning method that is performed after epitaxial film formation for manufacturing an epitaxial wafer with minimized generation of particles from the back surface or edge portion of the wafer during semiconductor device manufacturing processes.

Solution to Problem

The present invention has been made to achieve the above object, and provides an epitaxial wafer cleaning method for cleaning a wafer having an epitaxial film formed on a front surface thereof, comprising:

a first cleaning step of supplying a cleaning solution containing $O_3$ to all surfaces, including front, back, and end surfaces, of the wafer to perform spin cleaning;

a second cleaning step of supplying a cleaning solution to the back and end surfaces of the wafer to perform cleaning with a roll brush after the first cleaning step;

a third cleaning step of supplying a cleaning solution containing $O_3$ to the front surface of the wafer to perform spin cleaning after the second cleaning step; and a fourth cleaning step of supplying a cleaning solution containing HF to the front surface of the wafer to perform spin cleaning after the third cleaning step.

Such an epitaxial wafer cleaning method can provide an epitaxial wafer with minimized generation of particles from the back surface or edge portion of the wafer during semiconductor device manufacturing processes.

Preferably, the third cleaning step and the fourth cleaning step are performed in this order a plurality of times after the second cleaning step.

This can provide a cleaner front surface condition for the wafer.

Preferably, after the fourth cleaning step, a step of supplying a cleaning solution containing $O_3$ to the front surface of the wafer to perform spin cleaning is performed as a final cleaning step.

This can form an oxide film on the front surface of the wafer and allow it to serve as a protective film.

Preferably, a PVA brush is used as the roll brush.

This can prevent metal contamination on the wafer.

Advantageous Effects of Invention

As described above, the inventive epitaxial wafer cleaning method can provide an epitaxial wafer cleaning method that is performed after epitaxial film formation for manufacturing an epitaxial wafer with minimized generation of particles from the back surface or edge portion of the wafer during semiconductor device manufacturing processes. During single-wafer cleaning of the wafer after having an epitaxial film formed thereon, brush cleaning is performed on the back surface and the edge portion of the wafer, followed by spin cleaning of the front surface. This can reduce particles on the front surface, back surface, and edge portion and achieve the best cleanliness through the cleaning.

BRIEF DESCRIPTION OF DRAWINGS

FIG. 1 is an enlarged side view of a portion, including a brush cleaning unit, of a cleaning apparatus used in the cleaning method according to the present invention;

FIG. 2 is an enlarged bottom view of the portion, including the brush cleaning unit, of the cleaning apparatus used in the cleaning method according to the present invention;

FIG. 3 is a graph showing particle removal rates for the back surface of the wafer in each cleaning method performed in Example and Comparative Examples; and FIG. 4 is a graph showing particle removal rates for the end surface (edge portion) of the wafer in each cleaning method performed in Example and Comparative Examples.

DESCRIPTION OF EMBODIMENTS

Hereinafter, the present invention will be described in detail, but the present invention is not limited to the following description.

As described above, a need has existed for an epitaxial wafer cleaning method that is performed after epitaxial film formation for manufacturing an epitaxial wafer with minimized generation of particles from the back surface or edge portion of the wafer during semiconductor device manufacturing processes.

Hence, the present inventors investigated cleaning capabilities to remove particles on the back surface and the edge portion of the wafer after having an epitaxial film formed thereon, and found that the particle removal rate is greatly affected by which cleaning method is used.

Batch SC-1 (an $NH_4OH/H_2O_2/H_2O$ cleaning solution mixture) cleaning was capable of removing particles at both low and high temperatures of the cleaning solution, but not at a satisfactory level.

Also, cleaning with an $O_3/HF$ cleaning solution mixture, ultrasonic-assisted cleaning with an $O_3/HF$ solution mixture, oxide film delaminating cleaning with an HF aqueous solution, and two-fluid cleaning with pure water and air, all conducted using a single-wafer spin cleaning machine, did not provide a satisfactory level of particle removal capabilities.

Then, the present inventors tried cleaning with brushes and found it to be cleaning with a satisfactory level of particle removal capabilities. Additionally, while brushes used for cleaning can be broadly classified into roll brushes and disk brushes, roll brushes were found to have higher particle removal capabilities.

Cleaning with roll brushes includes a method of rotating two roll brushes and placing a wafer therebetween to simultaneously clean both front and back surfaces of the wafer with the brushes, and a method of pressing one roll brush against either the front or back surface of the wafer to clean only one surface of the wafer. The method of simultaneously cleaning both front and back surfaces of the wafer by rotating two roll brushes was found to degrade the cleanliness of the front surface of the wafer with an epitaxial film formed thereon, which is inherently sufficiently clean (without cleaning) with few particles, because the brush cleaning causes adhesion of microparticles as the brush contacts the epitaxial film on the front surface of the wafer.

From the above, it was found that the batch cleaning and the single-wafer spin cleaning without brush cleaning cannot sufficiently remove particles on the back surface or edge portion of the wafer after having an epitaxial film formed thereon. Thus, the present inventors have found that it is possible to achieve the best cleanliness with the fewest particles on the front surface, back surface, and edge portion of the wafer by cleaning the back surface and the edge portion with roll brushes and cleaning the front surface only by spin cleaning.

The present inventors have earnestly studied to solve the above problems and consequently found that it is possible to provide an epitaxial wafer cleaning method that is performed after epitaxial film formation for manufacturing an epitaxial wafer with minimized generation of particles from the back surface or edge portion of the wafer during semiconductor device manufacturing processes by employing an epitaxial wafer cleaning method for cleaning a wafer having an epitaxial film formed on a front surface thereof, comprising: a first cleaning step of supplying a cleaning solution containing $O_3$ to all surfaces, including front, back, and end surfaces, of the wafer to perform spin cleaning; a second cleaning step of supplying a cleaning solution to the back and end surfaces of the wafer to perform cleaning with a roll brush after the first cleaning step; a third cleaning step of supplying a cleaning solution containing $O_3$ to the front surface of the wafer to perform spin cleaning after the second cleaning step; and a fourth cleaning step of supplying a cleaning solution containing HF to the front surface of the wafer to perform spin cleaning after the third cleaning step. This finding has led to the completion of the present invention.

A description will be given below with reference to the drawings.

First, a cleaning apparatus used in the cleaning method according to the present invention will be described. An ordinary spin cleaning apparatus may be used for spin cleaning performed in the first, third, and fourth cleaning steps. In such cases, a parallel arrangement of a spin cleaning unit that can rotate a wafer W while holding it in a chamber section and supply a chemical solution to the front and back surfaces of the rotating wafer from a chemical solution supply nozzle and a brush cleaning unit (described below) is possible. The wafer can be transferred to the respective units for cleaning as appropriate according to each cleaning step.

A brush cleaning unit used in the second cleaning step will now be described. The second cleaning step in the cleaning method according to the present invention can employ a brush cleaning unit that performs single-wafer spin brush cleaning. FIG. 1 depicts an enlarged side view of a portion, including the brush cleaning unit, of the cleaning apparatus used in the cleaning method according to the present invention, and FIG. 2 depicts a bottom view of the portion. The brush cleaning unit for the second cleaning step in the cleaning method according to the present invention can include a plurality of wafer rotating rollers 3 that rotate the wafer W while holding it, a chemical solution supply nozzle 4a that supplies a chemical solution to the front surface of the rotating wafer W, a chemical solution supply nozzle 4b that supplies a chemical solution to the back surface, a chemical solution supply nozzle 4c that supplies a chemical solution to the end surface, an edge brush 1, which is a roll brush, that holds and rotates the wafer W and performs brush cleaning of the edge portion of the wafer W, and a backside brush 2, which is a roll brush, that is longer than the diameter of the wafer W and can clean the entire back surface of the wafer W. It should be noted that the wafer W is shown transparent in FIG. 2 for the purpose of illustration, so that the chemical solution supply nozzle 4a, which supplies a chemical solution to the front surface of the wafer W, is visible from the bottom side.

Preferably, the brush cleaning unit includes an edge brush holding jig 5 that holds the wafer W and connects to a driving section for rotating the wafer W, and a backside brush cleaning section that connects to a driving section for rotating the backside brush 2, which is the roll brush longer than the diameter of the wafer W, and cleans the back surface of the wafer W by rotating and pressing this backside brush 2, which is the roll brush against the back surface. The brush cleaning unit may include a plurality of edge brush holding jigs 5 and a plurality of edge brushes 1, which is the roll brush.

The edge brush 1 and the backside brush 2, both are the roll brush, are preferably made of resin, and more preferably made of polyvinyl alcohol (PVA), from the viewpoint of metal impurity contamination on the wafer W.

The cleaning method according to the present invention will now be described.

First, a wafer with an epitaxial film formed on a front surface thereof is provided, for which the cleaning method according to the present invention is to be performed. The type of the wafer to be provided is not particularly limited as long as it is an epitaxial wafer. For example, a silicon epitaxial wafer with a silicon epitaxial film formed on a silicon wafer can be used, though the material of the wafer can be selected as appropriate. In the case of forming a silicon epitaxial film on a silicon wafer, for example, the epitaxial film can be formed by introducing gases, such as trichlorosilane, into a chamber section in an epitaxial apparatus under a high temperature and decomposing these gases to epitaxially grow a silicon single crystal film on the front surface of the wafer.

Then, as the first cleaning step, the epitaxial wafer is set in the spin cleaning unit, and an $O_3$-containing cleaning solution is supplied to all surfaces of the wafer W, including the front, back and end surfaces, to perform spin cleaning. In this first cleaning step, the front surface of the wafer W after having the epitaxial film formed thereon is in a very active state. Thus, spin cleaning is performed with the $O_3$-containing cleaning solution in order to decompose and remove organic matter so that contamination by particles, organic matter, metallic impurities, etc., will not occur, as well as to form an oxide film on all surfaces of the front, back, and end surfaces. Preferably, the $O_3$-containing cleaning solution is supplied from the chemical solution supply nozzle located at the center of the rotating wafer W for a period of time to sufficiently cover the wafer W and to decompose and remove organic matter and form a sufficient oxide film on all surfaces. At this time, as the $O_3$-containing cleaning solution having been supplied to the front and back surfaces of the wafer W reaches, and is thus supplied to, the end surface, organic matter on the end surface of the wafer W can also be decomposed and removed. The $O_3$-containing cleaning solution may be supplied separately toward the end surface of the wafer W. Alternatively, after spin cleaning of the front surface, the wafer may be inverted to perform spin cleaning of the back surface.

As the second cleaning step after the first cleaning step, the wafer is transferred to the brush cleaning unit shown in FIGS. 1 and 2, where the brush cleaning unit is used to supply a cleaning solution to the back and end surfaces of the wafer and clean them with the edge brush 1 and the backside brush 2, both are the roll brush. In the second cleaning step, brush cleaning of the edge portion of the wafer W is performed while the wafer W is rotated by the edge brush 1, which is the roll brush holding it, and simultaneously or sequentially brush cleaning of the back surface of the wafer W is performed by rotating and pressing the backside brush 2, which is the roll brush longer than the diameter of the wafer W, against the back surface of the wafer W. At this time, since the brushes (e.g., made of resin such as PVA) are in rotating contact with the back surface and the edge portion of the wafer W, the brush cleaning is performed with continued supply of the cleaning solution to prevent any damages. Preferably, the cleaning solution is supplied to the front surface of the wafer W as well to prevent particles generated by the brush cleaning from adhering to the front surface of the wafer W. There are no limitations to the cleaning solution to be supplied, and it can be, for example, pure water or ammonia-hydrogen peroxide solution. Also, there are no limitations to the rotation speed of the wafer W and the rotation speed of the backside brush 2. There are also no particular limitations to the force by which the backside brush 2 is to be pressed.

As the third cleaning step after the second cleaning step, the wafer is transferred to, and set in, the spin cleaning unit, where the $O_3$-containing cleaning solution is supplied to the front surface of the wafer W to perform spin cleaning. Further, as the fourth cleaning step after the third cleaning step, an HF-containing cleaning solution is supplied to the front surface of the wafer W to perform spin cleaning. While the front surface of the wafer W is cleaned after performing the brush cleaning of the back surface and the edge portion of the wafer W in the second cleaning step, the front surface of the wafer W after having the epitaxial film formed thereon is inherently very clean with few particles adhered. Since the oxide film has already been formed as a protective film by the $O_3$-containing cleaning solution in the first cleaning step, particles adhered during the brush cleaning are removed along with the oxide film as the protective film when it is removed. Performing the cleaning of the third cleaning step using the $O_3$-containing cleaning solution and the fourth cleaning step using the HF-containing cleaning solution in this order can achieve a very clean front surface condition, with few particles adhered, that is comparable to the cleanliness after the epitaxial film formation.

Additionally preferably, the third cleaning step and the fourth cleaning step are repeated a plurality of times in this order after the second cleaning step. Also preferably, after the fourth cleaning step, a step of supplying an $O_3$-containing cleaning solution to the front surface of the wafer to perform spin cleaning is performed as a final cleaning step in order to form an oxide film on the front surface of the wafer W and allow it to serve as a protective film.

After the cleaning, the method can move to a step of evaluating particles on the back surface and the edge portion of the wafer W. For the evaluation step for the back surface of the wafer W, a sensitive evaluation is possible by evaluating the wafer W that is inverted such that its front surface comes to the side that is originally on the back. For evaluating particles on the back surface, the number of particles (defects) can be measured using, for example, an SP5 particle counter manufactured by KLA Corporation. For evaluating particles on the edge portion, the number of particles (defects) on the edge portion can be measured using an edge inspection apparatus EZ-300 manufactured by Lasertec Corporation.

EXAMPLE

The present invention is described below in detail using Example, although this Example does not limit the present invention.

Example

First, as the first cleaning step, spin cleaning was performed by supplying $O_3$ water to the front and back surfaces of the wafer sufficiently enough to cover its end surface. The wafer rotation speed was set to 1000 rpm, the $O_3$ concentration to 20 ppm, the temperature to 24° C., the $O_3$ water flow rate to 1 L/min, and the cleaning time to 20 sec.

Then, as the second cleaning step, brush cleaning was performed on the back surface and the edge portion of the wafer. The wafer rotation speed was set to 50 rpm, the edge brush rotation speed to 20 rpm, and the backside brush rotation speed to 150 rpm. Pure wafer was flowed as the cleaning solution, with the pure water flow rate set to 1 L/min and the cleaning time to 40 sec.

Then, as the third cleaning step, spin cleaning was performed by flowing $O_3$ water to the front surface of the wafer. The wafer rotation speed was set to 1000 rpm, the $O_3$ concentration to 20 ppm, the temperature to 24° C., the $O_3$ water flow rate to 1 L/min, and the cleaning time to 20 sec. Subsequently, as the fourth cleaning step, spin cleaning of the front surface was performed by flowing HF. The wafer rotation speed was set to 1000 rpm, the HF concentration to 0.3 wt. % (mass percent concentration), the temperature to 24° C., the HF flow rate to 1 L/min, and the cleaning time to 7 sec. The third cleaning step and the fourth cleaning step were repeated twice in this order.

Then, as the final cleaning step, spin cleaning of the front surface of the wafer was performed by flowing $O_3$ water. The wafer rotation speed was set to 300 rpm, the $O_3$ concentration to 20 ppm, the temperature to 24° C., the $O_3$ water flow rate to 1 L/min, and the cleaning time to 40 sec.

The wafer was then dried with the wafer rotation speed set to 1000 rpm and the drying time to 30 sec.

Comparative Example 1

Cleaning and drying of an epitaxial wafer was performed in the same manner as in Example, except that brush cleaning was not performed.

Comparative Example 2

SC-1 cleaning of an epitaxial wafer was performed using a batch cleaning machine. Using chemical solutions of 28 wt. % $NH_4OH$ and 30 wt. % $H_2O_2$, the wafer was cleaned by immersion in an $NH_4OH/H_2O_2/H_2O$ (1:1:10) cleaning solution mixture for 5 minutes at a liquid temperature of 70° C.

For the epitaxial wafers used in Example and Comparative Example, particle removal rates were evaluated for the back surface and the edge portion of the same wafer after formation thereon of an epitaxial film (before the cleaning steps) and after the cleaning steps. For the back surface, the number of particles (defects) of 28 nm or greater was measured using an SP5 particle measuring instrument manufactured by KLA Corporation; for the edge portion, the number of particles (defects) on the edge portion was measured using an edge inspection apparatus EZ-300 manufactured by Lasertec Corporation. The number of particles adhered to the back surface after the epitaxial film formation was taken as 1 and compared to the number of particles after the cleaning steps, and a ratio with respect to the number of particles removed was calculated for comparison of the cleaning effect as expressed in terms of removal rates.

FIG. 3 is a graph showing particle removal rates for the back surface of the wafer in each cleaning method performed in Example and Comparative Examples. FIG. 4 is a graph showing particle removal rates for the end surface of the wafer in each cleaning method performed in Example and Comparative Examples. The particle removal rates for the back surface were 5% in Comparative Example 1 (spin cleaning without brush cleaning), 33% in Comparative Example 2 (batch cleaning), and 83% in Example (spin cleaning with brush cleaning). The particle removal rates for the edge portion were 37% in Comparative Example 1 (spin cleaning without brush cleaning), 48% in Comparative Example 2 (batch cleaning), and 66% in Example (spin cleaning with brush cleaning). In a separately conducted evaluation of the front surface of the epitaxial wafer, no increase in the particle level on the front surface from what it had been after the epitaxial film formation (before the cleaning steps) was observed in Example.

Comparison between Example and Comparative

Examples 1, 2 demonstrates that, during single-wafer spin cleaning of the wafer after having an epitaxial film formed thereon, performing cleaning with an $O_3$-containing cleaning solution to decompose and remove organic matter on the front, back, and end surfaces of the wafer and to form an oxide film, then performing brush cleaning of the back and end surfaces, followed by cleaning the front surface of the wafer by sequentially performing spin cleaning with an $O_3$-containing cleaning solution and spin cleaning with HF made it possible to remove particles on the back and end surfaces while maintaining the particle level on the front surface as it had been after the epitaxial film formation, thereby improving the cleanliness of the wafer to a favorable level.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. An epitaxial wafer cleaning method comprised of cleaning steps for cleaning a wafer having an epitaxial film formed on a front surface thereof, the cleaning steps consisting of:
   a first cleaning step of supplying a cleaning solution containing $O_3$ to all surfaces, including the front surface, a back surface, and an end surface, of the wafer to perform spin cleaning;
   a second cleaning step of supplying a cleaning solution to the front surface, the back surface and the end surface of the wafer while only the back surface and the end surface are being cleaned with roll brushes, after the first cleaning step;
   a third cleaning step, performed after the second cleaning step, of supplying a cleaning solution containing $O_3$ to the front surface of the wafer to perform spin cleaning; and
   a fourth cleaning step of supplying a cleaning solution containing HF to the front surface of the wafer to perform spin cleaning after the third cleaning step, wherein after the second cleaning step, the third cleaning step is optionally performed a plurality of times, each time together with and followed by the fourth cleaning step; and
   optionally, after a final one of the fourth cleaning step, a fifth cleaning step of supplying a cleaning solution containing $O_3$ to the front surface of the wafer to perform spin cleaning.

2. The epitaxial wafer cleaning method according to claim 1, wherein after the second cleaning step, the third cleaning step is performed a plurality of times, each time together with and followed by the fourth cleaning step.

3. The epitaxial wafer cleaning method according to claim 1, wherein the fifth cleaning step is performed as a final cleaning step.

4. The epitaxial wafer cleaning method according to claim 1, wherein PVA brushes are used as the roll brushes.

5. The epitaxial wafer cleaning method according to claim 2, wherein PVA brushes are used as the roll brushes.

6. The epitaxial wafer cleaning method according to claim 3, wherein PVA brushes are used as the roll brushes.

\* \* \* \* \*